(12) United States Patent
Lin et al.

(10) Patent No.: US 9,489,991 B2
(45) Date of Patent: Nov. 8, 2016

(54) MEMORY READING CIRCUIT, MEMORY DEVICE AND METHOD OF OPERATING MEMORY DEVICE

(71) Applicant: TAIWAN SEMICONDUCTOR MANUFACTURING COMPANY, LTD., Hsinchu (TW)

(72) Inventors: Yangsyu Lin, New Taipei (TW); Hsin-Hsin Ko, Hsinchu (TW); Chiting Cheng, Taichung (TW); Cheng Hung Lee, Hsinchu (TW); Jonathan Tsung-Yung Chang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 48 days.

(21) Appl. No.: 14/193,412

(22) Filed: Feb. 28, 2014

(65) Prior Publication Data

US 2015/0248923 A1    Sep. 3, 2015

(51) Int. Cl.
| | |
|---|---|
| *G11C 7/06* | (2006.01) |
| *G11C 7/08* | (2006.01) |
| *G11C 11/419* | (2006.01) |
| G11C 7/00 | (2006.01) |
| G11C 7/12 | (2006.01) |

(52) U.S. Cl.
CPC ............... *G11C 7/08* (2013.01); *G11C 11/419* (2013.01); *G11C 7/00* (2013.01); *G11C 7/065* (2013.01); *G11C 7/12* (2013.01)

(58) Field of Classification Search
CPC ................................. G11C 7/065; G11C 7/00
USPC ......................................... 365/189.05, 189.11
See application file for complete search history.

(56) References Cited

U.S. PATENT DOCUMENTS

2014/0204683 A1* 7/2014 Sahu ...................... G11C 7/065
                                                                365/189.05

* cited by examiner

*Primary Examiner* — Jason Lappas
(74) *Attorney, Agent, or Firm* — Hauptman Ham, LLP (57) ABSTRACT

A circuit for reading a memory device includes a sense amplifier (SA) and a controller. The SA has an input, an output and an enabling terminal. The controller has a first input coupled to the output of the SA, a second input configured to receive a control signal, and an output coupled to the enabling terminal of the SA to send an SA enabling (SAE) signal from the controller to the SA. The controller is configured to start the SAE signal, in response to the control signal, to enable the SA, and to terminate the SAE signal, in response to an SA output signal at the output of the SA, to disable the SA.

20 Claims, 8 Drawing Sheets

MEMORY READING CIRCUIT, MEMORY DEVICE AND METHOD OF OPERATING MEMORY DEVICE

BACKGROUND

Processors and memories are various parts of computing systems and electronic devices. The performance of a memory impacts the overall performance of the system or electronic device. Various circuits are developed to improve one or more aspects of memory performance, such as capacity, access speed, power consumption and the like aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a first element is described as being "connected" or "coupled" to a second element, such a description includes embodiments in which the first and second elements are directly connected or coupled to each other, and also includes embodiments in which the first and second elements are indirectly connected or coupled to each other with one or more other intervening elements in between.

Figure 1:
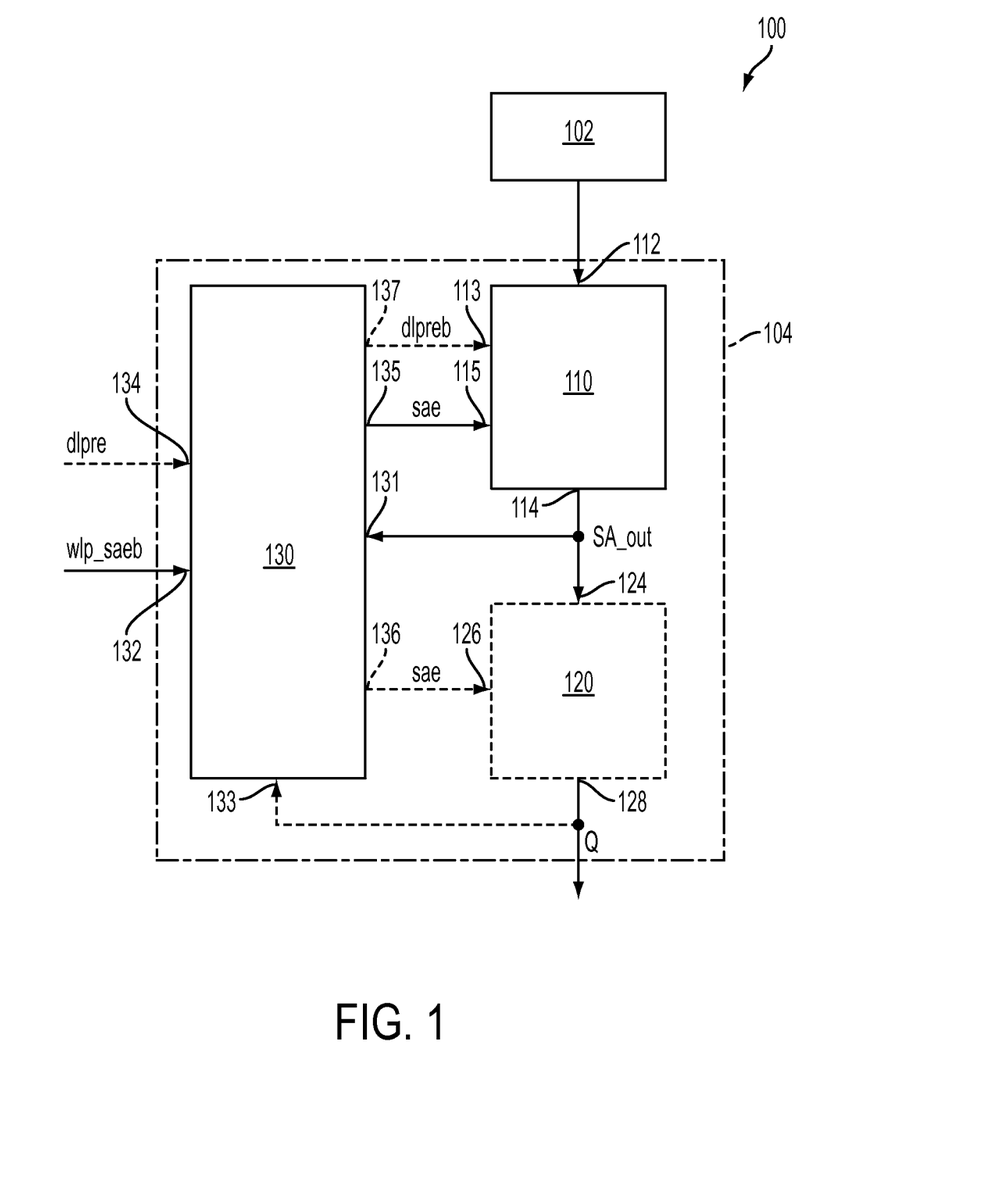
FIG. 1 is a schematic block diagram of a memory device in accordance with some embodiments.

FIG. 1 is a schematic block diagram of a memory device 100 in accordance with some embodiments. The memory device 100 comprises at least one memory cell 102, and a circuit 104 for reading the memory cell 102. In at least one embodiment, the memory cell 102 includes a static random access memory cell (SRAM). Other types of memory arrangements are within the scope of various embodiments. The circuit 104 comprises a sense amplifier 110, a latch 120, and a controller 130.

The sense amplifier 110 has a first input 112, a second input 113, an output 114 and an enabling terminal 115. The first input 112 is coupled to the memory cell 102 to access the memory cell 102. The sense amplifier 110 is configured to read out a datum stored in the memory cell 102 via the first input 112 during a read operation. The second input 113 is coupled to the controller 130 to receive a precharge signal dlpreb for a precharging stage during the read operation. In at least one embodiment, the second input 113 is omitted. The sense amplifier 110 is configured to output a sense amplifier output signal SA_out corresponding to the read datum at the output 114. The enabling terminal 115 is coupled to the controller 130 to receive a sense amplifier enabling signal sae. The sense amplifier 110 is configured to be enabled by the signal sae, and to be disabled in the absence of the signal sae.

The latch 120 has a first input 124, a second input 126 and an output 128. The first input 124 is coupled to the output 114 of the sense amplifier 110 to receive the signal SA_out from the sense amplifier SA. The latch 120 is configured to latch the signal SA_out and output the latched signal SA_out as a latch output signal Q at the output 128. The second input 126 is coupled to the controller 130 to receive the signal sae. The latch 120 is configured to be enabled by the signal sae, and to be disabled in the absence of the signal sae. In at least one embodiment, another latch enabling signal, such as a clock signal, is inputted to the second input 126 instead of the signal sae. The latch 120 enabled by the signal sae or another latch enabling clock signal is referred to as a clocked latch. In at least one embodiment, the second input 126 is omitted. The latch 120 not enabled by the signal sae or another latch enabling signal is referred to as a non-clocked latch. In at least one embodiment, the latch 120 is omitted.

The controller 130 has a first input 131, a second input 132, a third input 133, a fourth input 134, a first output 135, a second output 136 and a third output 137. The first input 131 is coupled to the output 114 of the sense amplifier 110 to receive the signal SA_out. the second input 132 is configured to receive a sense amplifier control signal wlp_saeb. The third input 133 is coupled to the output 128 of the latch 120 to receive the signal Q. The fourth input 134 is configured to receive a precharge control signal dlpre. The first output 135 is coupled to the enabling terminal 115 of the sense amplifier 110 to send the signal sae to the sense amplifier SA. The second output 136 is coupled to the second input 126 of the latch 120 to send the signal sae or another latch enabling signal, such as a clock signal, to the latch 120. The third output 137 is coupled to the second input 113 of the sense amplifier 110 to send the precharge signal dlpreb to the sense amplifier SA.

In at least one embodiment, the first output 135 and the second output 136 are combined as one output for outputting the signal sae to both the sense amplifier 110 and the latch 120. In at least one embodiment, the second output 136 is omitted from the controller 130, for example, when the latch 120 is a non-clocked latch.

In at least one embodiment, the controller 130 is configured to generate the precharge signal dlpreb based on the signal sae and the signal dlpre, and to output the precharge signal dlpreb to the sense amplifier 110 via the third output 137. In at least one embodiment, the fourth input 134 and the third output 137 are omitted from the controller 130. For example, the signal dlpre is inputted to the sense amplifier SA, e.g., via the second input 113, and the sense amplifier 110 is configured to generate the precharge signal dlpreb based on the signal dlpre and the signal sae.

The controller 130 is configured to start the signal sae, in response to the signal wlp_saeb, to enable the sense amplifier SA. The controller 130 is further configured to terminate the signal sae, in response to the signal SA_out at the output 114 of the sense amplifier SA, to disable the sense amplifier SA. As a result, at least one embodiment, the signal sae is not terminate and the sense amplifier 110 is not disabled until the signal SA_out is reliably outputted.

In other approaches, the signal sae is terminated and the sense amplifier 110 is disabled without consideration of the signal SA_out. For example, in some other approaches, a pulse width or duration of the signal sae is controlled by a pulse width of the signal wlp_saeb alone. In some situations, the signal wlp_saeb travels to the controller 130 through heavily loaded connecting circuitry which potentially results in a significant shortening (or "evaporation") of the pulse width of the signal wlp_saeb. When the pulse width of the signal wlp_saeb arriving at the controller 130 is shortened, the corresponding pulse width of the signal sae is potentially insufficient for a reliable signal SA_out to be outputted. As a consequence, a failed read operation potentially occurs. Compared to such other approaches, the circuit 104 in accordance with some embodiments ensures that the sense amplifier 110 is enabled during a period sufficient for the signal SA_out to be reliably outputted. As a result, one or more issues associated with the signal wlp_saeb having an insufficient pulse width are avoided and/or the intended functionality of the sense amplifier 110 is ensured regardless of process-voltage-temperature (PVT) variations.

In at least one embodiment, the controller 130 is configured to control a pulse width of the signal sae based on the signal SA_out and the pulse width of the signal wlp_saeb.

In some embodiments, the controller 130 is configured to control a pulse width of the signal sae regardless of the pulse width of the signal wlp_saeb. As a result, in at least one embodiment, the sense amplifier 110 is not enabled beyond a period sufficient for the signal SA_out to be reliably outputted, avoiding one or more issues associated with the signal wlp_saeb having an excessive pulse width. For example, when the signal wlp_saeb has an excessive pulse width and the pulse width of the signal sae depends on the excessive pulse width of the signal wlp_saeb, the sense amplifier 110 is enabled during an excessively long period which increases power consumption and/or reduces the reading speed. By controlling the pulse width of the signal sae independently of the pulse width of the signal wlp_saeb, power consumption is reduced and/or the read cycle time is improved.

In some embodiments, the controller 130 is configured to terminate the signal sae in response to both the signal SA_out at the output 114 of the sense amplifier 110 and the signal Q at the output 128 of the latch 120. As a result, in at least one embodiment, the sense amplifier 110 is enabled during a period sufficient for both the signal SA_out and the signal Q to be reliably outputted. In at least one embodiment, the circuit 104 avoids one or more issues associated with the signal wlp_saeb having an insufficient pulse width and/or ensures the intended functionality of the sense amplifier 110 and the latch 120 regardless of PVT variations.

In some embodiments, the controller 130 is configured to control the pulse width of the signal sae based on the signal SA_out and the signal Q, regardless of the pulse width of the signal wlp_saeb. As a result, the sense amplifier 110 is not enabled beyond a period sufficient for the signal SA_out and the signal Q to be reliably outputted. In at least one embodiment, the circuit 104 avoids one or more issues associated with the signal wlp_saeb having an excessive pulse width and/or improves at least one of power consumption or read cycle time.

In at least one embodiment, the third input 133 is omitted from the controller 130, and the controller 130 is configured to control the pulse width of the signal sae based on the signal SA_out, without consideration of the signal Q.

In at least one embodiment, the controller 130 optimizes the pulse width of the signal sae, or the duration of the period during which the sense amplifier 110 is enabled, and therefore optimizes the read cycle time regardless of PVT variations.

Figure 2:
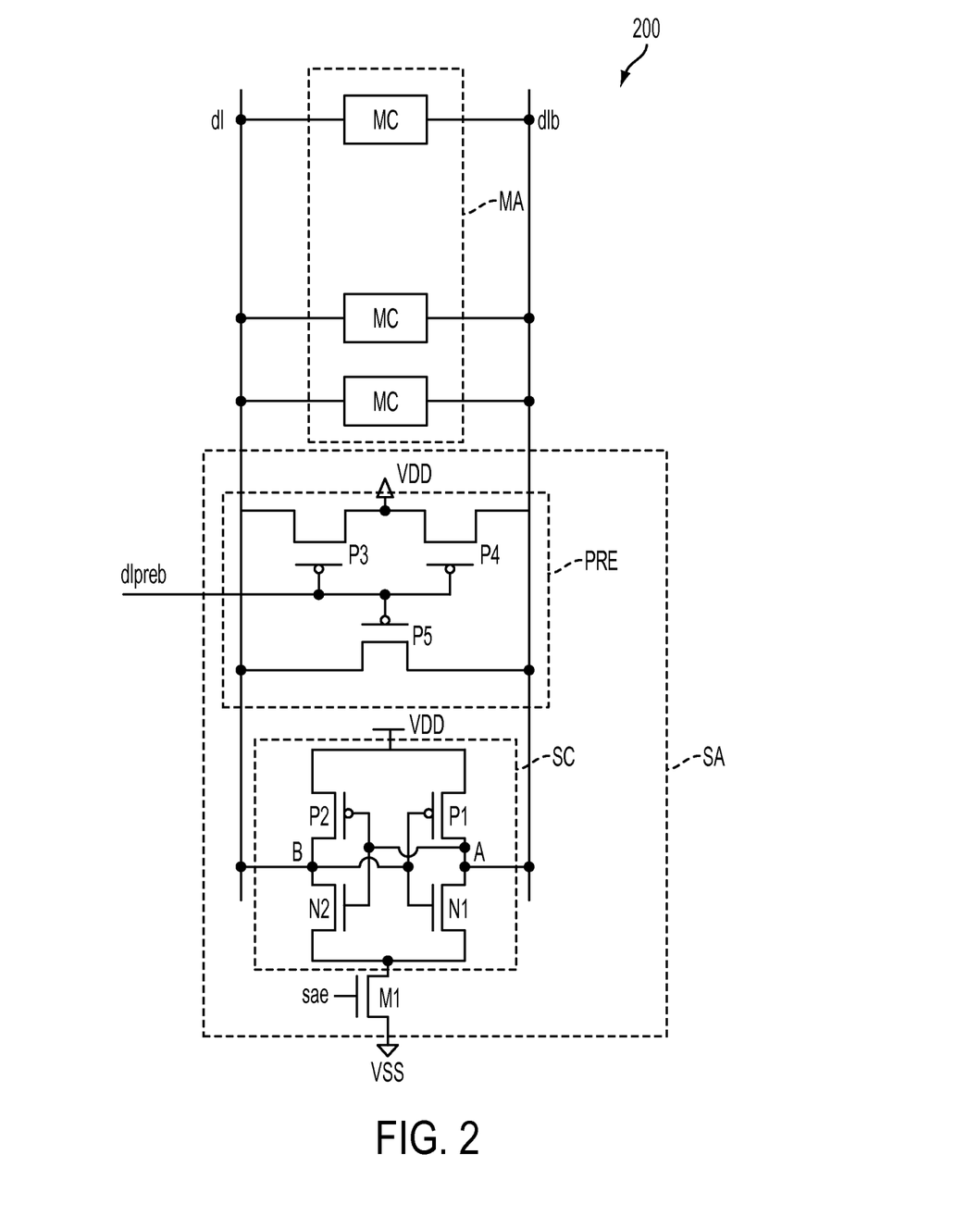
FIG. 2 is a schematic circuit diagram of a memory device in accordance with some embodiments.

FIG. 2 is a schematic circuit diagram of a memory device 200 in accordance with some embodiments. The memory device 200 comprises a first data line dlb, a second data line dl, and a plurality of memory cells MC and a sense amplifier SA coupled to the data line dl and data line dlb. The memory cells MC define a memory array MA. In some embodiments, the memory cells MC corresponding to the at least one memory cell 102 and the sense amplifier SA corresponds to the sense amplifier 110 as described with respect to FIG. 1.

The sensing amplifier SA comprises a sensing circuit SC, a precharging circuit PRE, and a switch M1. The sensing circuit SC comprises a first node A coupled to the data line dlb, a second node B coupled to the data line dl, a first power supply voltage node VDD and a second power supply voltage node VSS. VDD is used herein to interchangeably denote both the first power supply voltage node and a first power supply voltage at the first power supply voltage node, and VSS is used herein to interchangeably denote both the second power supply voltage node and a second power supply voltage at the second power supply voltage node. In at least one embodiment, VSS is a ground voltage. Other voltage arrangements are within the scope of various embodiments. The switch M1 is coupled between the sensing circuit SC and VSS. In the example configuration disclosed in FIG. 2, the switch M1 includes a transistor. Other switching arrangements are within the scope of various embodiments.

The sensing circuit SC further comprises transistors N1, N2, P1 and P2. The transistor N1 and the transistor P1 are coupled in series between VDD and VSS. Specifically, a source of the transistor N1 is coupled to VSS via the transistor M1, a drain of the transistor N1 is coupled to a drain of the transistor P1 at the node A, and a source of the transistor P1 is coupled to VDD. The transistor N2 and the transistor P2 are coupled in series between VDD and the VSS. Specifically, a source of the transistor N2 is coupled to VSS via the transistor M1, a drain of the transistor N2 is coupled to a drain of the transistor P2 at the node B, and a source of the transistor P2 is coupled to VDD. The node A is coupled to gates of the transistor N2 and transistor P2, and to the output device NAND1. The node B is coupled to gates of the transistor N1 and transistor P1. The transistor M1 has a drain coupled to the sources of the transistor N1 and transistor N2, and a source coupled to VSS. The transistor M1 is controlled to turn ON or OFF by the signal sae to correspondingly enable and disable the sense amplifier SA. The transistor N1, transistor N2, transistor P1 and transistor P2 define a cross-coupled latch having complementary logic states at the node A and node B. The described sensing circuit SC is an example. Other sensing circuit configurations are within the scope of various embodiments.

The precharging circuit PRE comprises transistors P3, P4 and P5. Gates of the transistors P3, P4, and P5 are configured to receive the precharge signal dlpreb. Sources of the transistors P3 and P4 are coupled to the corresponding data line dl and data line dlb. Drains of the transistors P3 and P4 are coupled to VDD. A drain and a source of the transistor P5 are coupled to the corresponding data line dl and data line dlb. The described precharging circuit PRE is an example. Other precharging circuit configurations are within the scope of various embodiments. In at least one embodiment, the precharging circuit PRE is arranged outside the sense amplifier SA.

In one or more embodiments, the transistor N1, transistor N2, and transistor M1 are n-channel metal-oxide semiconductor (NMOS) transistors, whereas the transistors P1-P5 are p-channel metal-oxide semiconductor (PMOS) transistors. Other configurations are within the scope of various embodiments.

In a read operation, the data line dl and data line dlb are pre-charged by the precharge signal dlpreb. For example, when the precharge signal dlpreb having a low logic state is applied to the gates of the transistors P3-P5, the transistors P3-P5 are turned ON. As a result, the data line dl and data line dlb are pre-charged to VDD. Other precharge voltages are within the scope of various embodiments.

After the data line dl and data line dlb have been precharged, the precharge signal dlpreb is removed and the data line dl and data line dlb are left floating while a memory cell MC in the memory array MA is selected. Depending on the datum stored in the selected memory cell MC, a voltage difference is developed across the data line dlb and data line dl. The voltage difference is applied to the node A and the node B, and causes the cross-coupled latch to reach one of two stable states when the sensing amplifier SA is enabled by turning ON the transistor M1 with the signal sae.

Specifically, when reading logical "0," the voltage on the data line dlb and at the node A is pulled down whereas the voltage on the data line dl and at the node B is pulled up or stays at VDD. As a result, the transistor N1 and transistor P2 are turned ON, and the transistor N2 and transistor P1 are turned OFF. When the sense amplifier SA is enabled by turning ON the transistor M1, the node A is pulled down to VSS, and the cross-coupled latch reaches a stable state with logical "0" at the node A and logical "1" at the node B.

When reading logical "1," the voltage on the data line dlb and at the node A is pulled up or stays at VDD whereas the voltage on the data line dl and at the node B is pulled down. As a result, the transistor N1 and transistor P2 are turned OFF, and the transistor N2 and transistor P1 are turned ON. When the sense amplifier SA is enabled by turning ON the transistor M1, the node B is pulled down to VSS, and the cross-coupled latch reaches a stable state with logical "1" at the node A and logical "0" at the node B.

Figure 3A:
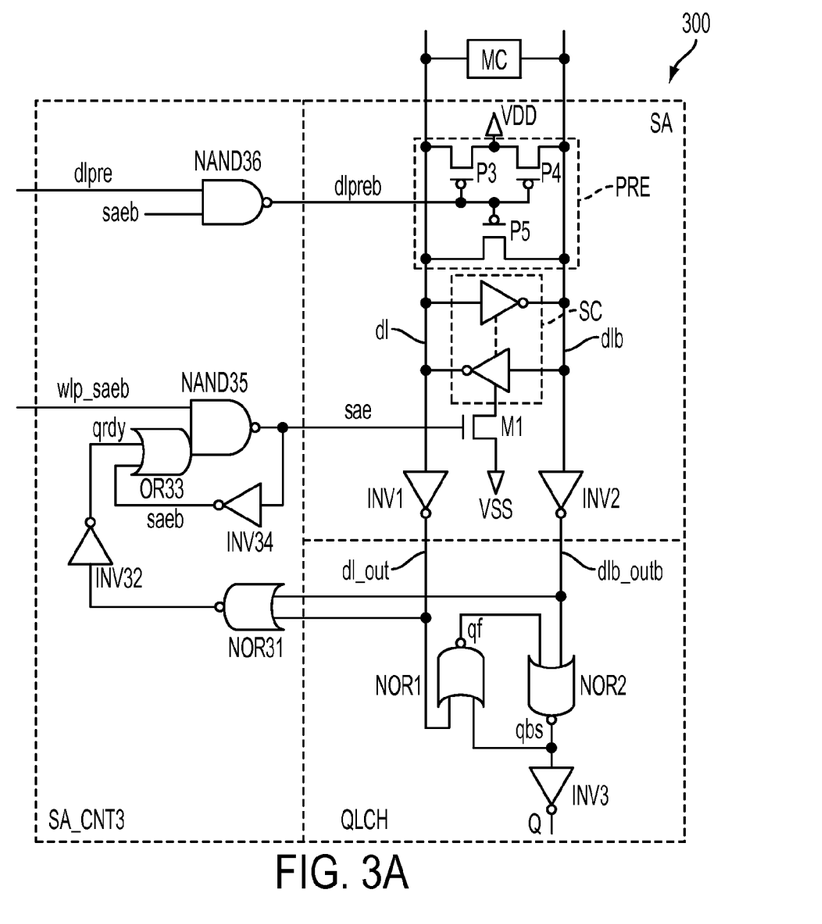
FIG. 3A is a schematic circuit diagram of a memory device and FIG. 3B is a timing diagram showing operation of the memory device, in accordance with some embodiments.
Figure 3B:
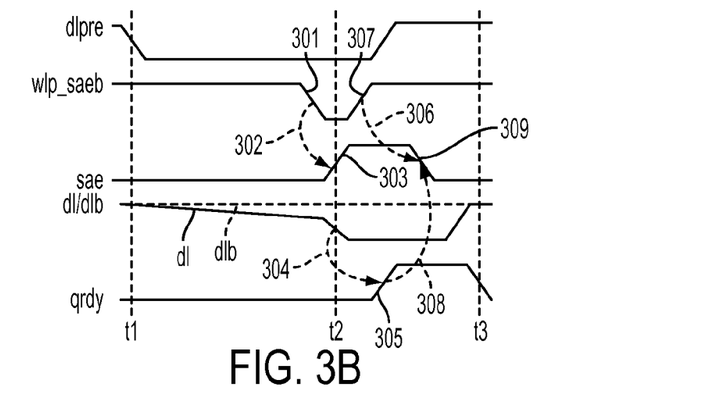

FIG. 3A is a schematic circuit diagram of a memory device 300, and FIG. 3B is a timing diagram showing operation of the memory device 300, in accordance with some embodiments. The memory device 300 comprises at least one memory cell MC, a sense amplifier SA, a latch QLCH and a controller SA_CNT3. In some embodiments, the memory cell MC, the sense amplifier SA, the latch QLCH and the controller SA_CNT3 correspond to the memory cell 102, the sense amplifier 110, the latch 120, and the controller 130 as described with respect to FIG. 1.

The sense amplifier SA corresponds to the sense amplifier SA described with respect to FIG. 2. In FIG. 3A, the sensing circuit SC is schematically illustrated as a cross-coupled latch as described with respect to FIG. 2. The sense amplifier SA in FIG. 3A further comprises inverters INV1 and INV2. Inputs of the inverters INV1 and INV2 are coupled to the corresponding data line dl and data line dlb. Outputs of the inverters INV1 and INV2 are configured to output corresponding signals dl_out and dl_outb. In some embodiments, the signals dl_out and dl_outb correspond to the signal SA_out as described with respect to FIG. 1.

The latch QLCH is a non-clocked SR-latch and comprises cross-coupled NOR gates NOR1 and NOR2. The gate NOR1 has a first input coupled to the output of the inverter INV1, a second input coupled to a first node qbs, and an output coupled to a first input of the gate NOR2. The gate NOR2 further has a second input coupled to the op output of the inverter INV2, and an output coupled to a second node qf. The latch QLCH further comprises an inverter INV3 having an input coupled to the node qbs, and an output configured to output the signal Q corresponding to a datum read by the sense amplifier SA from the memory cell MC. The described latch configuration is an example. Other latch configurations are within the scope of various embodiments.

The controller SA_CNT3 comprises a NOR gate NOR31, an inverter INV32, an OR gate OR33, a further inverter INV34, and a NAND gate NAND35. The gate NOR31 has a first input coupled to the output of the inverter INV1, a second input coupled to the output of the inverter INV2, and an output coupled to an input of the inverter INV32. The inverter INV32 further has an output coupled to a first input of the gate OR33. The gate OR33 further has a second input coupled to an output of the inverter INV34, and an output coupled to a first input of the gate NAND35. The gate NAND35 further has a second input configured to receive the signal wlp_saeb, and an output coupled to an input of the inverter INV34 and a gate of the transistor M1. The output of the gate NAND35 is configured to send the signal sae to the gate of the transistor M1 to enable the sense amplifier SA. A reverse signal saeb of the signal sae is generated at the output of the inverter INV34. A feedback signal qrdy corresponds to the signal SA_out of the sense amplifier SA and is generated at the output of the inverter INV32. The controller SA_CNT3 further comprises a NAND gate NAND36 having a first input configured to receive the signal saeb, for example, from the inverter INV34. The gate NAND36 further has a second input configured to receive the signal dlpre, and an output coupled to the gates of the transistors P3-P5 of the precharging circuit PRE in the sense amplifier SA. The described configuration of the controller SA_CNT3 is an example. Other circuits for performing the functionality of the controller SA_CNT3 as described herein are within the scope of various embodiments.

An example read operation of the memory device 300 in accordance with some embodiments is described with respect to FIG. 3B. Before a read operation, the signal sae and the signal qrdy have a low voltage level corresponding to logical "0," and the signal saeb and the signal wlp_saeb have a high voltage level corresponding to logical "1."

The read operation starts with pre-charging the data line dl and data line dlb by inputting the signal dlpre having a high voltage level corresponding to logical "1" to the gate NAND36. In response to the signal saeb and the signal dlpre both having logical "1," the gate NAND36 output the precharge signal dlpreb having logical "0" to the precharging circuit PRE. As a result the data line dl and data line dlb are pre-charged to VDD as described with respect to FIG. 2.

At time t1, the signal dlpre is switched to a low voltage level corresponding to logical "0" to end the pre-charging stage. A voltage difference (also referred to as "data line split") starts to develop between the floating data line dlb and data line dl, as described with respect to FIG. 2. For example, reading logical "1," the data line dl is pulled down from the precharge voltage VDD toward VSS, and the data line dlb stays at VDD as illustrate in FIG. 3B.

After a data line split has started to develop, the signal wlp_saeb is switched, at a leading edge 301, to a low voltage level corresponding to logical "0." In response to the signal wlp_saeb having logical "0," the gate NAND35 switches the output thereof from logical "0" to logical "1" and starts the signal sae. As indicated by arrow 302, the leading edge 301 of the signal wlp_saeb results in a leading edge 303 of the signal sae at time t2.

The started signal sae enables the sense amplifier SA by turning ON the transistor M1. In the example of reading logical "1" in FIG. 3B, the data line dl is pulled down to VSS while the data line dlb stays at VDD. The sensing circuit SC reaches a stable state with logical "0" on the data line dl and logical "1" on the data line dlb. The inverter INV1 outputs the signals dl_out of logical "1" and the inverter INV2 outputs the signal dl_outb of logical "0." When reading logical "0," inverter INV1 outputs the signals dl_out of logical "0" and the inverter INV2 outputs the signal dl_outb of logical "1." In either case, one signal of logical "0" and one signal of logical "1" are inputted to the gate NOR31 indicating that the sense amplifier SA has outputted a reliable signal SA_out or a reliable reading of the datum stored in the memory cell MC.

In response to one input signal of logical "0" and one input signal of logical "1," the gate NOR31 outputs logical "0" to the inverter INV32. The inverter INV32, in turn, switches the output thereof from logical "0" to logical "1." As indicated by arrow 304 in FIG. 3B, the sufficiently developed data line split results in a leading edge 305 of the signal qrdy. The signal qrdy having logical "1" and the signal saeb having logical "0" are inputted to the gate OR33 which outputs logical "1" to the first input of the gate NAND35. The second input of the gate NAND35 receives the signal wlp_saeb and is switched to logical "1" on a trailing edge 307 of the signal wlp_saeb. In response to logical "1" at both inputs, the gate NAND35 switches the output thereof to logical "0" and terminates the signal sae. As indicated by arrows 306 and 308 in FIG. 3B, a trailing edge 309 of the signal sae is a result of both the trailing edge 307 of the signal wlp_saeb and the leading edge 305 of the signal qrdy. The trailing edge 309 of the signal sae is controlled in accordance with the later of the trailing edge 307 of the signal wlp_saeb and the leading edge 305 of the signal qrdy. At time t3, the memory device 300 returns to a state ready for another read operation with the data line dl and data line dlb pre-charged in accordance with the high voltage level of the signal dlpre.

In the described operation in accordance with some embodiments, the signal sae is not terminated until both inputs of the gate NAND35 are at logical "1." In a situation when the pulse width of the signal wlp_saeb between the leading edge 301 and the trailing edge 307 is shortened, the second input of the gate NAND35 is switched to logical "1" but the signal sae is not terminated (i.e., switched to logical "0") until the signal qrdy of logical "1" is received. The signal qrdy is not switched to logical "1" until one signal of logical "0" and one signal of logical "1" are inputted to the gate NOR31, indicating that a sufficient data line split is detected by the sensing circuit SC and a reliable signal SA_out is outputted by the sense amplifier SA. Before a data line split is sufficiently developed to be detected by the sensing circuit SC (i.e., to cause the sensing circuit SC to reach one of two stable states), both data line dl and data line dlb have sufficiently high voltage levels corresponding to logical "1" which, in turn, causes the signals dl_out and dl_outb both having logical "0" to be inputted to the gate NOR31 and prohibits the signal qrdy from switching to logical "1" and the signal sae from switching to logical "0" or being terminated. As a result, one or more issues associated with a shortened pulse width of the signal wlp_saeb are avoidable in one or more embodiments to ensure intended functionality of the sense amplifier SA.

Figure 4A:
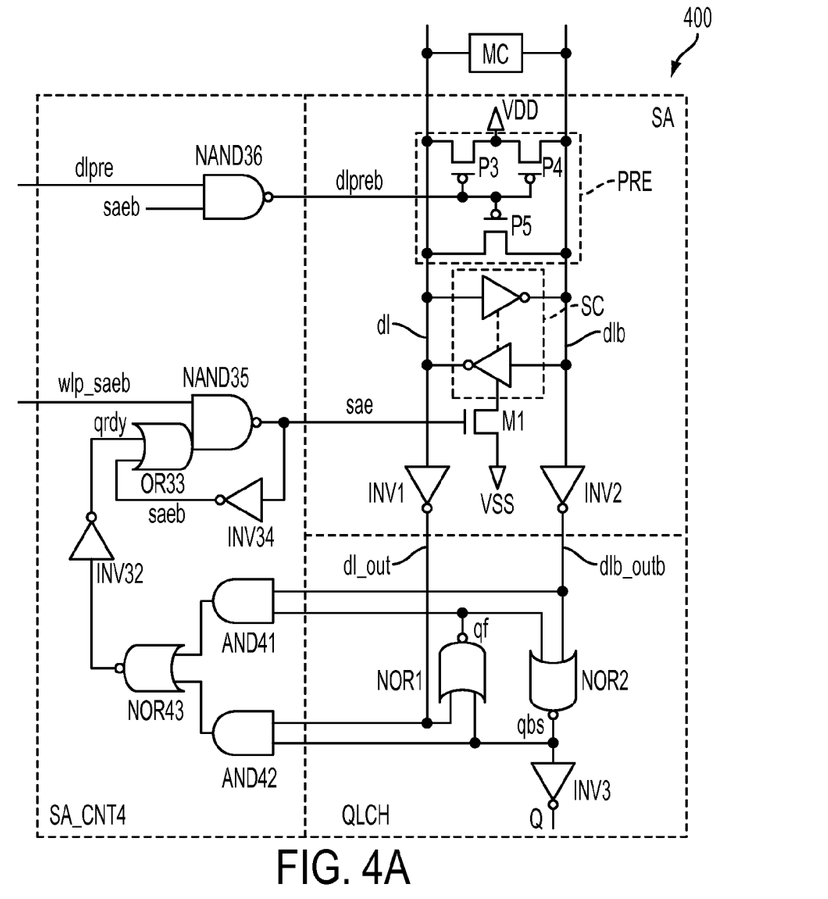
FIG. 4A is a schematic circuit diagram of a memory device and FIG. 4B is a timing diagram showing operation of the memory device, in accordance with some embodiments.
Figure 4B:
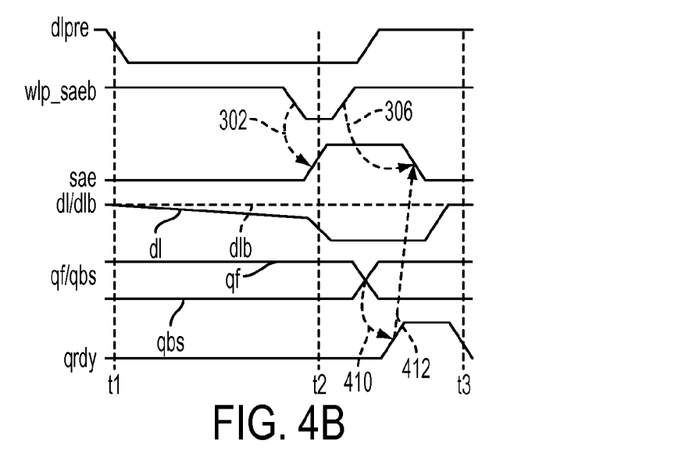

FIG. 4A is a schematic circuit diagram of a memory device 400, and FIG. 4B is a timing diagram showing operation of the memory device 400, in accordance with some embodiments. The memory device 400 is different from the memory device 300 in the configuration of the controller SA_CNT4. Instead of the gate NOR31 in the memory device 300, the controller SA_CNT4 in the memory device 400 includes AND gates AND41, AND42 and a NOR gate NOR43. The gate AND41 has a first input coupled the node qf, a second input coupled to the output of the inverter INV2, and an output coupled to a first input of the gate NOR43. The gate AND42 has a first input coupled the node qbs, a second input coupled to the output of the inverter INV1, and an output coupled to a second input of the gate NOR43. The gate NOR43 has an output coupled to the input of the inverter INV32. In some embodiments, the signals inputted from the node qf and node qbs correspond to the signal Q as described with respect to FIG. 1. As a result, the signal qrdy corresponds to both the signal SA_out of the sense amplifier SA and the latch output signal of the latch QLCH. The described configuration of the controller SA_CNT4 is an example. Other circuits for performing the functionality of the controller SA_CNT4 as described herein are within the scope of various embodiments.

An example read operation of the memory device 400 in accordance with some embodiments is described with respect to FIG. 4B. As described with respect to FIG. 3B, the data line dl and data line dlb are pre-charged then left floating, a data line split starts to develop between the data line dl and data line dlb, and the signal sae is started in response to the signal wlp_saeb to enable the sensing circuit SC to detect the data line split.

When the data line split is detected by the sensing circuit SC, one of the signals dl_out and dl_outb has logical "0" and the other has logical "1" which results in the node qf and node qbs switching the logical states thereof, of flipping. As indicated at arrow 410 in FIG. 4B, the flipping of the node qf and node qbs causes the signal qrdy to switch from logical "0" to logical "1." As indicated at arrows 306 and 412 in FIG. 4B, the later of the leading edge of the signal qrdy and a trailing edge of the signal wlp_saeb causes a trailing edge of the signal sae, or causes the signal sae to be terminated.

In the described operation in accordance with some embodiments, the signal sae is not terminated until both inputs of the gate NAND35 are at logical "1." In a situation when the pulse width of the signal wlp_saeb between the leading edge 301 and the trailing edge 307 is shortened, the second input of the gate NAND35 is switched to logical "1" but the signal sae is not terminated (i.e., switched to logical "0") until the signal qrdy of logical "1" is received. Because the signal qrdy is generated in accordance with both the signal SA_out of the sense amplifier SA and the latch output signal of the latch QLCH, the signal qrdy is not switched to logical "1" until both the signal SA_out and the latch output signal are reliably outputted. For example, after the signal SA_out is reliably outputted but before the flipping of the node qf and node qbs, both the gate AND41 and gate AND42 output logical "0" to the corresponding inputs of the gate NOR43, prohibiting the signal qrdy from switching to logical "1" and the signal sae from being terminated. As a result, one or more issues associated with a shortened pulse width of the signal wlp_saeb are avoidable in one or more embodiments to ensure intended functionality of both the sense amplifier SA and the latch QLCH.

Figure 5A:
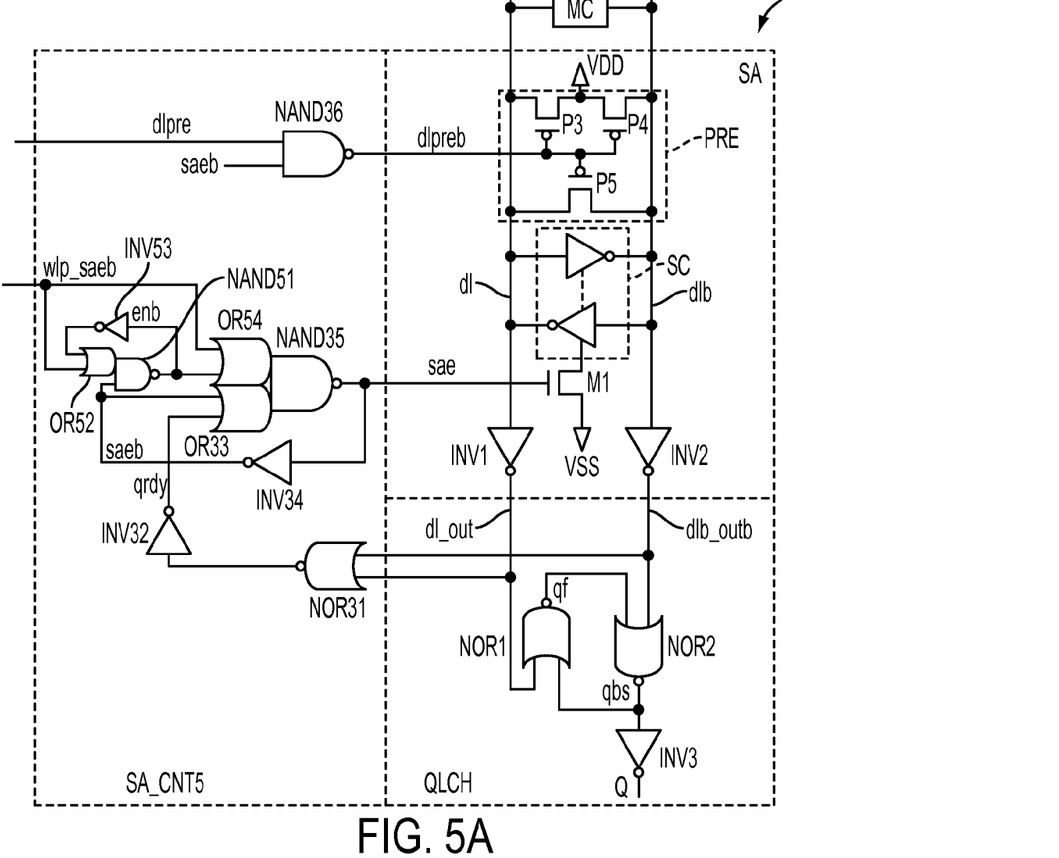
FIG. 5A is a schematic circuit diagram of a memory device and FIG. 5B is a timing diagram showing operation of the memory device, in accordance with some embodiments.
Figure 5B:
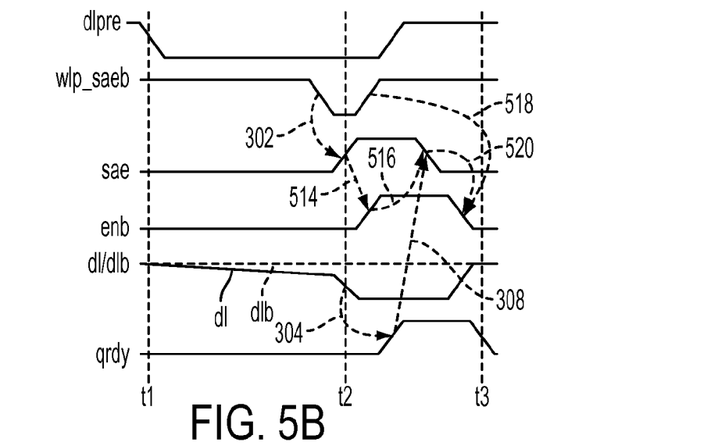

FIG. 5A is a schematic circuit diagram of a memory device 500, and FIG. 5B is a timing diagram showing operation of the memory device 500, in accordance with some embodiments. The memory device 500 is different from the memory device 300 in the configuration of the controller SA_CNT5. Compared to the controller SA_CNT3 in the memory device 300, the controller SA_CNT5 in the memory device 500 additionally includes a NAND gate NAND51, an OR gate OR52, an inverter INV53 and an OR gate OR54. The gate NAND51 has a first input coupled to the output of the inverter INV34 to receive the signal saeb, a second input coupled to an output of the gate OR52, and an output coupled to a first input of the gate OR54. The gate OR52 has a first input coupled to an output of the inverter INV53, and a second input configured to receive the signal wlp_saeb. The inverter INV53 has an input coupled to the output of the gate NAND51. The gate OR54 has a second input configured to receive the signal wlp_saeb, and an output coupled to the second input of the gate NAND35. The signal qrdy is generated based on the signal SA_out as described with respect to the memory device 300. An intermediate signal enb is generated at the output of the gate NAND51. The described configuration of the controller SA_CNT5 is an example. Other circuits for performing the functionality of the controller SA_CNT5 as described herein are within the scope of various embodiments.

An example read operation of the memory device 500 in accordance with some embodiments is described with respect to FIG. 5B. As described with respect to FIG. 3B, the data line dl and data line dlb are pre-charged then left floating, a data line split starts to develop between the data line dl and data line dlb, and the signal sae is started in response to the signal wlp_saeb to enable the sensing circuit SC to detect the data line split. As also described with respect to FIG. 3B, the detected data line split causes the signal qrdy to switch from logical "0" to logical "1" at a leading edge which causes a trailing edge of the signal sae. The operation of the memory device 500, in accordance with some embodiments, is different from the operation of the memory device 300 in that the controller SA_CNT5 controls the trailing edge of the signal sae without consideration of the trailing edge of the signal wlp_saeb or regardless of the pulse width of the signal wlp_saeb.

As indicated in FIG. 5B, before the signal sae is started, the signal enb at the output of the gate NAND51 has logical "0." When the signal sae is started or switches to logical "1" in response to the leading edge of the signal wlp_saeb, the signal saeb switches to logical "0" which causes the signal enb at the output of the gate NAND51 to switch from logical "0" to logical "1." As indicated by arrow 514 in FIG. 5B, a leading edge of the signal sae results in a leading edge of the signal enb. The signal enb having logical "1" maintains the output of the gate OR54 at logical "1" regardless of a trailing edge or pulse width of the signal wlp_saeb. As a result, the signal sae is terminated independently of the trailing edge or pulse width of the signal wlp_saeb. As indicated at arrows 516 and 308 in FIG. 5B, the controller SA_CNT5 controls a trailing edge of the signal sae in accordance with a leading edge of the signal enb and a leading edge of the signal qrdy. When the signal sae is terminated, the signal saeb is switched back to logical "1" and causes the signal enb at the output of the gate NAND51 to be logical "0." As indicated at arrows 518 and 520 in FIG. 5B, the controller SA_CNT5 controls a trailing edge of the signal enb in accordance with the trailing edge of the signal wlp_saeb and the trailing edge of the signal sae.

In the described operation in accordance with some embodiments, the signal sae is terminated independently of the trailing edge or pulse width of the signal wlp_saeb. As a result, one or more issues associated with an excessive pulse width of the signal wlp_saeb are avoidable in one or more embodiments to improve the read cycle time and/or power consumption of the memory device 500.

Figure 6A:
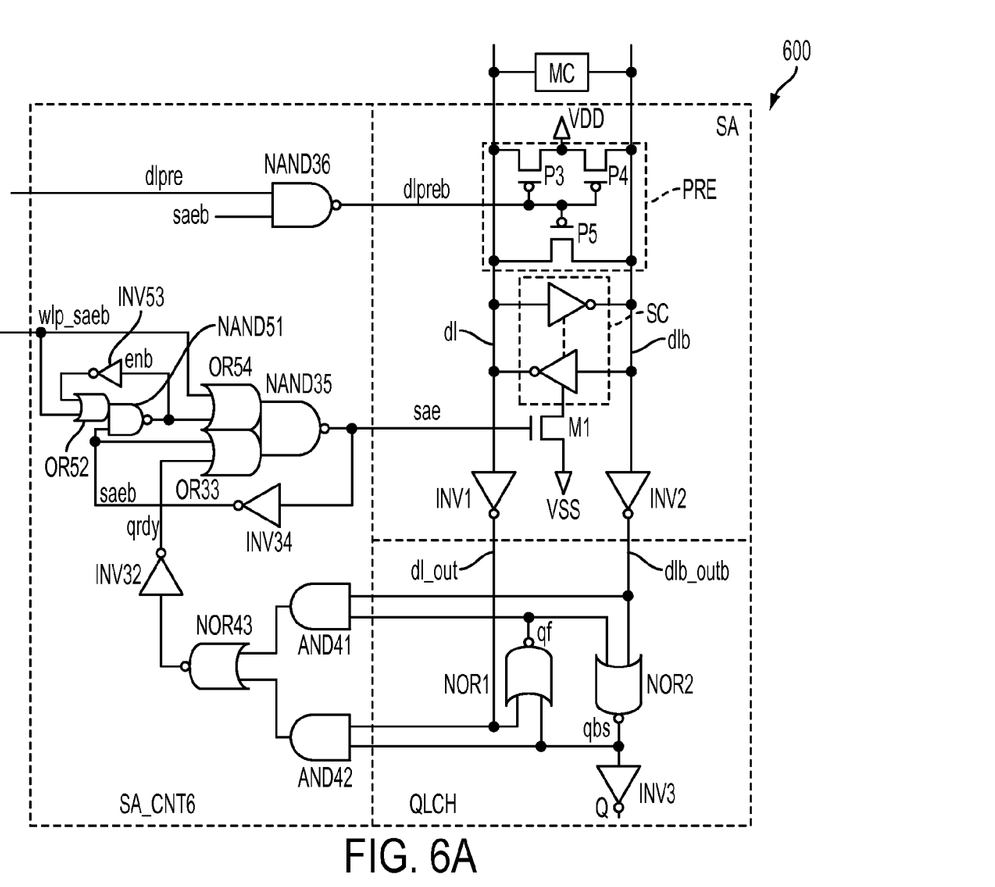
FIG. 6A is a schematic circuit diagram of a memory device and FIG. 6B is a timing diagram showing operation of the memory device, in accordance with some embodiments.
Figure 6B:
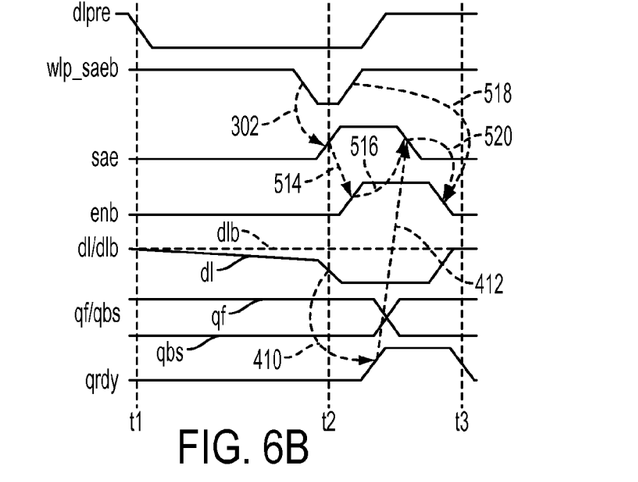

FIG. 6A is a schematic circuit diagram of a memory device 600 and FIG. 6B is a timing diagram showing operation of the memory device 600, in accordance with some embodiments. The memory device 600 is different from the memory device 500 in the configuration of the controller SA_CNT6. Instead of the gate NOR31 in the memory device 500, the controller SA_CNT6 in the memory device 600 includes AND gates AND41, AND42 and a NOR gate NOR43 as described with respect to the controller SA_CNT4 in the memory device 400. In other words, the controller SA_CNT6 of the memory device 600 in accordance with some embodiments is a combination of the controller SA_CNT4 in the memory device 400 and the controller SA_CNT5 in the memory device 500. As indicated in FIG. 6B, an operation of the memory device 600 in accordance with some embodiments is a combination of the operation of the memory device 400 and the operation of the memory device 500. As a result, one or more effects described with respect to the memory device 400 and memory device 500 is/are achievable in the memory device 600.

Figure 7:
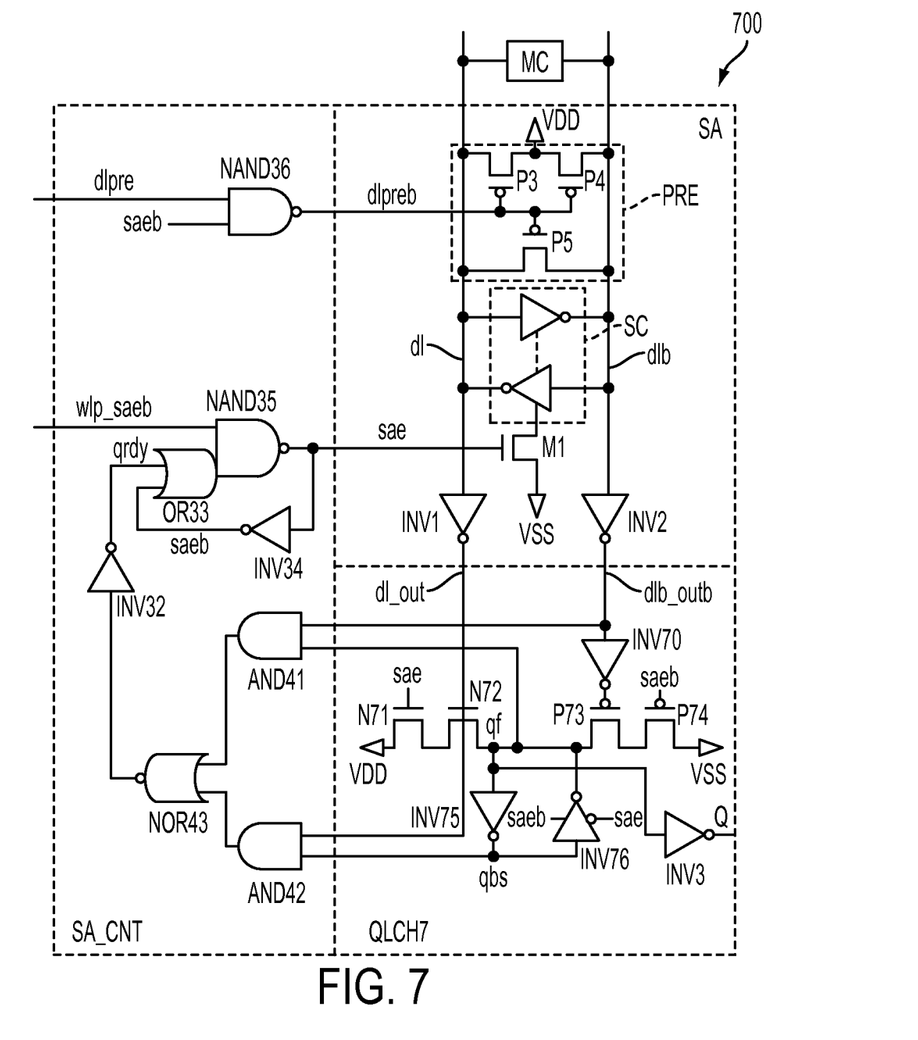
FIG. 7 is a schematic circuit diagram of a memory device in accordance with some embodiments.

FIG. 7 is a schematic circuit diagram of a memory device 700 in accordance with some embodiments. The memory device 700 is different from the memory device 400 in the configuration of the latch QLCH7 which is a clocked latch. The latch QLCH7 comprises an inverter INV70, transistors N71, N72, P73, P74, and inverters INV75, INV76 and INV3. The inverter INV70 has an input coupled to the output of the inverter INV2, and an output coupled to a gate of the transistor P73. A gate of the transistor N72 is coupled to the output of the inverter INV1. Gates of the transistors N71, P74 are configured to receive the corresponding signal sae and signal saeb. Drains and sources of the transistors N71, N72, P73 and P74 are serially connected between VDD and VSS. The inverters INV75 and INV76 are cross-coupled. The inverter INV75 has an input coupled to a node qf between the transistors N72 and P73, and an output coupled to a node qbs. The inverter INV76 has an input coupled to the node qbs and an output coupled to the node qf. The inverter INV76 is enabled by the signal saeb. An input of the inverter INV3 is coupled to the node qf and an output of the inverter INV3 is configured to outputted the signal Q. In some embodiments, the signal sae and signal saeb are inputted to enable the latch QLCH7 and correspond to the signal sae outputted from the controller 130 to the latch 120, as described with respect to FIG. 1. Other than the latch QLCH7 enabled by the signal sae and signal saeb, one or more other aspects in the operation of the memory device 700 are similar to those in the operation of the memory device 400.

Figure 8:
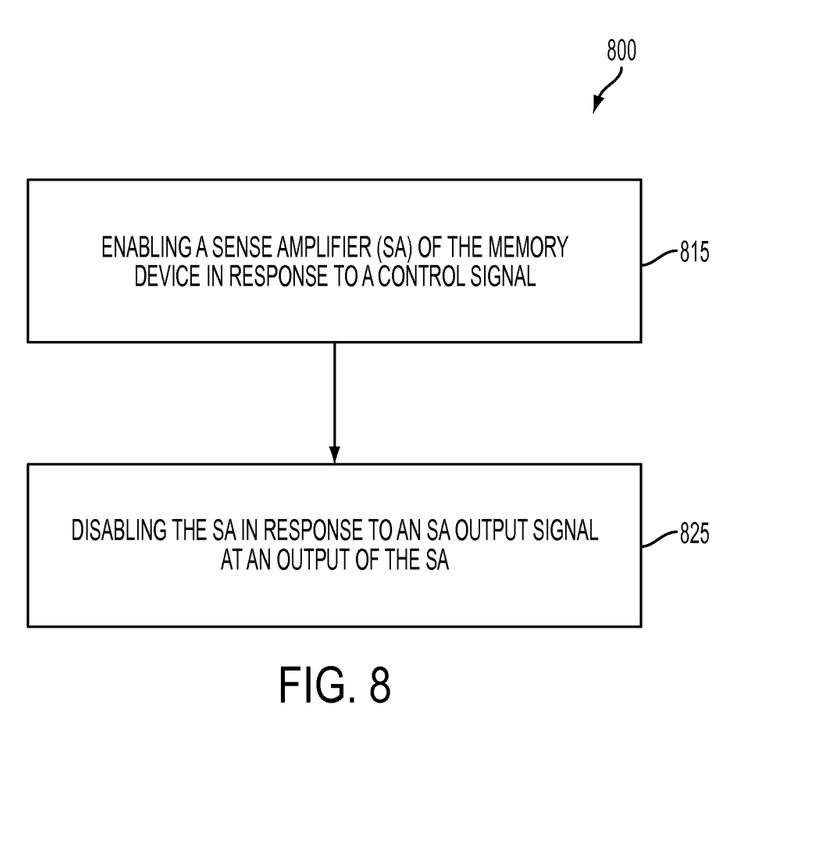
FIG. 8 is a flow chart of a method of operating a memory device in accordance with some embodiments.

FIG. 8 is a flow chart of a method 800 of operating a memory device in accordance with some embodiments. In some embodiments, the method 800 is performed in at least one of the memory device 100, the memory device 300, the memory device 400, the memory device 500, the memory device 600 or the memory device 700.

At operation 815, a sense amplifier (SA) of a memory device is enabled in response to a control signal. In an example, the sense amplifier 110 of the memory device 100 is enabled in response to the control signal wlp_saeb, as described herein with respect to FIG. 1. In a further example, the sense amplifier SA of at least one of the memory device 300, 400, 500, 600 or 700 is enabled in response to the control signal wlp_saeb, as described herein with respect to corresponding FIG. 3, 4, 5, 6 or 7.

At operation 825, the sense amplifier is disabled in response to an SA output signal at an output of the sense amplifier. In an example, the sense amplifier 110 of the memory device 100 is disabled in response to the signal SA_out at the output 114 of the sense amplifier 110, as described herein with respect to FIG. 1. In a further example, the sense amplifier SA of at least one of the memory device 300, 400, 500, 600 or 700 is disabled in response to the feedback signal qrdy corresponding to the signals dl_out and dl_outb at the output of the sense amplifier SA, as described herein with respect to corresponding FIG. 3, 4, 5, 6 or 7. In one or more embodiments, the sense amplifier is disabled, or the pulse width of the sense amplifier enabling signal sae is controlled, in accordance with a latch output signal at the output of a latch coupled to the sense amplifier and/or independently of a pulse width of the control signal wlp_saeb. As a result, one or more effects described herein are obtained in at least one embodiment.

The above method embodiment shows example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing various embodiments.

In some embodiments, a sense amplifier (SA) of a memory device is enabled in response to a control signal, and is disabled in response to an SA output signal at an output of the sense amplifier. As a result, in at least one embodiment, the sense amplifier is enabled during a period sufficient for the SA output signal to be reliably outputted, avoiding one or more issues associated with the control signal having an insufficient pulse width. In some embodiments, a pulse width of the sense amplifier enabling signal is controlled independently of a pulse width of the control signal. As a result, in at least one embodiment, the sense amplifier is not enabled beyond a period sufficient for the SA output signal to be reliably outputted, avoiding one or more issues associated with the control signal having an excessive pulse width.

In some embodiments, the sense amplifier is disabled further in response to a latch output signal outputted by a latch coupled to the output of the sense amplifier. As a result, in at least one embodiment, the sense amplifier is enabled during a period sufficient for both the SA output signal and the latch output signal to be reliably outputted. In some embodiments, a pulse width of the sense amplifier enabling signal is controlled independently of a pulse width of the control signal. As a result, in at least one embodiment, the sense amplifier is not enabled beyond a period sufficient for the SA output signal and the latch output signal to be reliably outputted.

In some embodiments, a circuit for reading a memory device comprises a sense amplifier (SA) and a controller. The SA has an input, an output and an enabling terminal. The controller has a first input coupled to the output of the SA, a second input configured to receive a control signal, and an output coupled to the enabling terminal of the SA to send an SA enabling (SAE) signal from the controller to the SA. The controller is configured to start the SAE signal, in response to the control signal, to enable the SA, and to terminate the SAE signal, in response to an SA output signal at the output of the SA, to disable the SA.

In some embodiments, a memory device comprises first and second data lines, at least one memory cell coupled to the first and second data lines, a sense amplifier (SA), and a controller. The SA comprises a sensing circuit coupled to the first and second data lines, and a switch coupled between the sensing circuit and a power supply voltage node. The controller comprises a first logic circuit and a second logic circuit. The first logic circuit has a first input coupled to the first data line, a second input coupled to the second data line, and an output. The second logic circuit has a first input coupled to the output of the first logic circuit, a second input configured to receive a control signal, and an output coupled to a control terminal of the switch.

In a method of operating a memory device in accordance with some embodiments, a sense amplifier (SA) of the memory device is enabled in response to a control signal and is disabled in response to an SA output signal at an output of the SA.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit for reading a memory device, the circuit comprising:
   a sense amplifier (SA) having an input, an output and an enabling terminal;
   a controller having
      a first input coupled to the output of the SA,
      a second input configured to receive a control signal, and
      a NAND gate having
         a first input coupled to the first input of the controller,
         a second input coupled to the second input of the controller, and
         an output coupled to the enabling terminal of the SA to send an SA enabling (SAE) signal from the controller to the SA, the controller configured to
  start the SAE signal, in response to the control signal, to enable the SA, and
  terminate the SAE signal, in response to an SA output signal at the output of the SA, to disable the SA.

2. The circuit of claim 1, wherein the controller is configured to control a pulse width of the SAE signal in accordance with a pulse width of the control signal.

3. The circuit of claim 1, wherein the controller is configured to control a pulse width of the SAE signal regardless of a pulse width of the control signal.

4. The circuit of claim 1, wherein the controller is configured to
  generate a feedback signal in response to the SA output signal, and
  control a trailing edge of the SAE signal in accordance with the later of a trailing edge of the control signal and a leading edge of the feedback signal.

5. The circuit of claim 1, wherein the controller is configured to
  generate a feedback signal in response to the SA output signal,
  generate an intermediate signal in response to a leading edge of the control signal, and
  control a trailing edge of the SAE signal in accordance with a leading edge of the intermediate signal and a leading edge of the feedback signal.

6. The circuit of claim 1, further comprising:
  a latch having an input coupled to the output of the SA, and an output,
  wherein the controller comprises a third input coupled to the output of the latch, the controller configured to terminate the enabling signal SAE in response to the SA output signal and a latch output signal at the output of the latch.

7. The circuit of claim 6, wherein the controller is configured to control a pulse width of the SAE signal in accordance with a pulse width of the control signal.

8. The circuit of claim 6, wherein the controller is configured to control a pulse width of the SAE signal regardless of a pulse width of the control signal.

9. The circuit of claim 6, wherein the controller is configured to
  generate a feedback signal in response to the SA output signal and the latch output signal, and
  control a trailing edge of the SAE signal in accordance with the later of a trailing edge of the control signal and a leading edge of the feedback signal.

10. The circuit of claim 6, wherein the controller is configured to
  generate a feedback signal in response to the SA output signal and the latch output signal,
  generate an intermediate signal in response to a leading edge of the control signal, and
  control a trailing edge of the SAE signal in accordance with a leading edge of the intermediate signal and a leading edge of the feedback signal.

11. A circuit for reading a memory device, the circuit comprising:
  a sense amplifier (SA) having an input, an output and an enabling terminal;
  a controller having
    a first input coupled to the output of the SA,
    a second input configured to receive a control signal, and
    a NAND gate having
      a first input coupled to the first input of the controller,
      a second input coupled to the second input of the controller, and
      an output coupled to the enabling terminal of the SA to send an SA enabling (SAE) signal from the controller to the SA,
  the controller configured to
    start the SAE signal, in response to the control signal, to enable the SA, and
    terminate the SAE signal, in response to an SA output signal at the output of the SA, to disable the SA; and
  a latch having an input coupled to the output of the SA and an output coupled to the controller.

12. The circuit of claim 11, wherein the sense amplifier (SA) comprises:
  a sensing circuit coupled to a first data line and a second data line of the memory device, and
  a switch coupled between the sensing circuit and a power supply voltage node.

13. The circuit of claim 12, wherein the switch receives the SAE signal from the controller.

14. The circuit of claim 12, wherein the controller further comprises:
  a NOR gate having a first input coupled to the first data line of the memory device, a second input coupled to the second data line of the memory device, and an output.

15. The circuit of claim 14, wherein the controller further comprises:
  an OR gate having a first input, a second input, and an output coupled to the first input of the NAND gate,
  a first inverter having an input coupled to the output of the NAND gate, and an output coupled to the first input of the OR gate, and
  a second inverter having an input coupled to the output of the NOR gate, and an output coupled to the second input of the OR gate.

16. The circuit of claim 15, wherein the controller further comprises:
  a first AND gate having a first input coupled to the first data line, a second input, and an output coupled to the first input of the NOR gate; and
  a second AND gate having a first input coupled to the second data line, a second input, and an output coupled to the second input of the NOR gate.

17. A circuit for reading a memory device, the circuit comprising:
  a sense amplifier (SA) having a first input, an output and an enabling terminal; and
  a controller having
    a first input coupled to the output of the SA,
    a second input configured to receive a control signal,
    a first NAND gate having
      a first input coupled to the first input of the controller,
      a second input coupled to the second input of the controller, and
      an output coupled to the enabling terminal of the SA to send an SA enabling (SAE) signal from the controller to the SA, and
    a second NAND gate having a first input configured to receive a reverse signal of the SAE signal, a second input configured to receive a precharge control signal, and an output configured to send a precharge signal to the SA,
  the controller configured to
    start the SAE signal, in response to the control signal, to enable the SA, and terminate the SAE signal, in response to an SA output signal at the output of the SA, to disable the SA.

18. The circuit of claim 17, wherein the sense amplifier further comprises:
a second input coupled to the controller and configured to receive the precharge signal.

19. The circuit of claim 17, further comprising:
a latch having
a first input coupled to the output of the SA,
a second input coupled to the controller and configured to receive an enabling signal, and
an output coupled to the controller.

20. The circuit of claim 19, wherein the enabling signal is a clock signal.

* * * * *